United States Patent
Choi et al.

(10) Patent No.: US 9,245,936 B2
(45) Date of Patent: Jan. 26, 2016

(54) MULTI-DISPLAY APPARATUS

(71) Applicant: Samsung Display Co., Ltd., Yongin, Gyeonggi-Do (KR)

(72) Inventors: Jun-Ho Choi, Yongin (KR); Jin-Koo Chung, Yongin (KR); Sang-Hoon Yim, Yongin (KR); Seong-Min Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 163 days.

(21) Appl. No.: 13/952,473

(22) Filed: Jul. 26, 2013

(65) Prior Publication Data

US 2014/0138643 A1     May 22, 2014

(30) Foreign Application Priority Data

Nov. 19, 2012  (KR) .................. 10-2012-0131106

(51) Int. Cl.
*H01L 27/32*     (2006.01)

(52) U.S. Cl.
CPC ......... *H01L 27/3267* (2013.01); *H01L 27/3244* (2013.01); *H01L 27/3293* (2013.01)

(58) Field of Classification Search
CPC ................. H01L 27/3267; H01L 27/3286
See application file for complete search history.

(56) References Cited

U.S. PATENT DOCUMENTS

| 2007/0001927 A1* | 1/2007 | Ricks et al. ................... 345/1.1 |
| 2008/0158482 A1* | 7/2008 | Jang et al. ....................... 349/73 |
| 2009/0236981 A1 | 9/2009 | Chang et al. |

FOREIGN PATENT DOCUMENTS

| JP | 2000-331779 | 11/2000 |
| JP | 2008-112112 | 5/2008 |
| KR | 1996-0014645 | 10/1996 |
| KR | 10-2009-0099744 | 9/2009 |

* cited by examiner

*Primary Examiner* — Gerald Johnson
(74) *Attorney, Agent, or Firm* — Christie, Parker & Hale, LLP

(57) ABSTRACT

Provided is a multi-display apparatus. The multi-display apparatus includes a first display including a region configured to allow external light to pass therethrough, a first module electrically coupled to the first display unit, a second display coupled to the first display, the second display overlapping the first module and being configured to not allow external light to pass therethrough, and a second module electrically coupled to the second display.

20 Claims, 9 Drawing Sheets

MULTI-DISPLAY APPARATUS

CROSS-REFERENCE TO RELATED APPLICATIONS

This application claims priority to and the benefit of Korean Patent Application No. 10-2012-0131106, filed on Nov. 19, 2012, in the Korean Intellectual Property Office, the disclosure of which is incorporated herein in its entirety by reference.

BACKGROUND

1. Field

Aspects of the present invention relate to a multi-display apparatus.

2. Description of the Related Art

In general, flat panel display devices may be classified as a light emission type or a light receiving type. Light emitting display apparatuses may include organic light emitting display devices (OLEDs), plasma display panels (PDPs), cathode ray tubes (CRTs), vacuum fluorescent display panels (VFDs), and light emitting diode panels (LEDs). Light receiving display apparatuses may include liquid crystal display (LCD) panels.

Among the above displays, an organic light emitting display device has advantages of a wide viewing angle, high contrast, and fast response speed. Accordingly, the organic light emitting display devices may be utilized for mobile devices such as digital cameras, video cameras, camcorders, portable information terminals, smartphones, ultra slim notebooks, tablet PCs, and electronic/electric appliances such as ultra slim televisions.

In a case of a large-sized window display device used as displays in stores, there is a limitation in forming the large-sized window display by using one display unit. Therefore, such a large-screen display may be realized by arranging a plurality of display units in a tiling way.

When forming a multi-display apparatus, transparent display units may be used so that displayed goods in stores may be seen from outside the store. However, if a plurality of transparent display units are arranged, module units having circuit boards included in the display units may be undesirably visible on certain portions, for example, bonding or attaching portions between the plurality of display units.

SUMMARY

Exemplary embodiments according to the present invention provide a multi-display apparatus that does not expose module units located at bonded or interfacing portions between display units to be visible from the outside, when a large screen is realized by combining a plurality of display units.

According to an aspect of the present invention, there is provided a multi-display apparatus including a first display comprising a region configured to allow external light to pass therethrough; a first module electrically coupled to the first display; a second display coupled to the first display, the second display overlapping the first module and being configured to not allow external light to pass therethrough; and a second module electrically coupled to the second display.

The first display and the second display may be alternately arranged in a direction and coupled to each other, and the first module may be coupled to a pad at an edge of the first display that is coupled to the second display.

The direction may be a vertical direction, and the first module may be behind the second display.

The direction may be a vertical direction, and the first module and the second module may be behind the second display.

The second display may cover the first module and the second module.

A plurality of the first displays may be successively arranged in a horizontal direction, and a plurality of the second displays may be successively arranged in the horizontal direction, and the first and second displays may be alternately arranged in a vertical direction.

The first module may be at a lower edge of the first display in the vertical direction, and may be behind the second display that is coupled to the first display in the vertical direction.

The first module and the second module may be at lower edges of the first display and the second display in the vertical direction, respectively, and the first module and the second module may be behind the second display.

A height of the first display may be greater than a height of the second display.

The second display may cover the first module and the second module.

The first module and the second module may include flexible circuit boards that are electrically coupled to a pad of the first display and a pad of the second display, respectively.

The first display may include a transparent organic light emitting display apparatus including: a substrate; an encapsulation unit on the substrate; a plurality of pixels on the substrate, wherein each of the pixels may include: a first region comprising a light emission region; and a second region comprising a transmission region configured to allow external light to pass therethrough; and an organic light emitting device at the light emission region of the pixels, and including a first electrode, a light emission layer, and a second electrode.

Each of the pixels may include: a pixel circuit comprising a thin film transistor (TFT) at the first region; a first insulating layer covering the pixel circuit; and a second insulating layer on the first insulating layer, covering edges of the first electrode, electrically coupled to the pixel circuit, and including a transmission window at the second region.

The first region of each of the pixels may include a light emission region and a circuit region, the TFT may be at the circuit region, the first electrode may be at the light emission region, and the light emission region and the circuit region may be adjacent to each other in each of the pixels.

The second region may be independently formed in each of the pixels.

The second regions of at least two adjacent pixels may be coupled to each other.

The transmission window may include a portion of the second insulating layer removed at a location corresponding to the second region.

The second display may include an opaque organic light emitting display, and the opaque organic light emitting display may include: a substrate; an encapsulation unit on the substrate; a thin film transistor (TFT) on the substrate, the TFT including a semiconductor active layer, a gate electrode, a source electrode, a drain electrode, and a plurality of insulating layers between the electrodes; and an organic light emitting device electrically coupled to the TFT comprising a first electrode, an organic emission layer on the first electrode, and a second electrode on the organic emission layer in each of pixels, wherein the opaque organic light emitting display is configured to not allow external light to pass therethrough.

The multi-display apparatus may further include a plurality of pixels at the substrate, wherein the pixels may include a light emission region and a non-emission region, and a reflective layer at a surface of the encapsulation unit facing the substrate, wherein the reflective layer may include openings corresponding to the light emission region and a reflective surface formed around the openings and corresponding to the non-emission region.

The non-emission region may further include a transmission region overlapping the reflective surface.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Although a few embodiments of the present invention have been shown and described, it would be appreciated by those skilled in the art that changes may be made in these exemplary embodiments without departing from the principles and spirit of the invention, the scope of which is defined in the claims and their equivalents.

It will be understood that although the terms "first" and "second" are used herein to describe various elements, these elements should not be limited by these terms. These terms are only used to distinguish one element from another element. Thus, a "first" element discussed below could be termed a "second" element, and similarly, a "second" element may be termed a "first" element without departing from the teachings of this disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, embodiments of a multi-display apparatus according to the present invention will be described in detail with reference to accompanying drawings. Further, when elements of the present invention are the same as those of a conventional art, they are represented by the same reference numbers or characters as used in the conventional art, and a detailed description thereof will be omitted.

As used herein, the term "and/or" includes any and all combinations of one or more of the associated listed items. Expressions such as "at least one of," when preceding a list of elements, modify the entire list of elements and do not modify the individual elements of the list.

Figure 1:
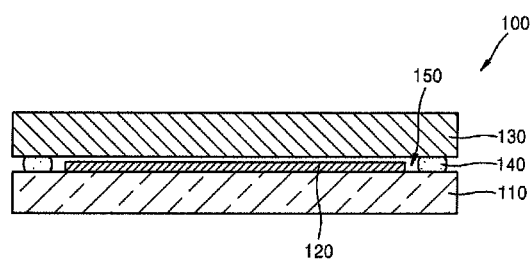
FIG. 1 is a schematic cross-sectional view of a display unit according to an embodiment of the present invention.

FIG. 1 is a schematic cross-sectional view of a display unit 100 according to an embodiment of the present invention.

In the present embodiment, the display unit 100 is an organic light emitting display device; however, the present invention is not limited thereto, provided that the display unit may display images when an electric power (e.g., a predetermined electric power) is applied thereto.

For example, the display unit 100 may be a liquid crystal display (LCD) panel, a plasma display panel (PDP), a light emitting diode (LED) panel, an electrochromic display panel, an electrowetting display panel, or a thin film electroluminescent (TFEL) panel.

Referring to FIG. 1, the display unit 100 includes a substrate 110, an organic emission unit 120 formed on the substrate 110, and an encapsulation unit 130 for sealing the organic emission unit 120.

The encapsulation unit 130 may be formed of a transparent material, for example, a glass material or a plastic material, so as to display images emitted from the organic emission unit 120. The encapsulation unit 130 reduces or prevents external air and moisture from infiltrating into the organic emission unit 120.

A sealing member 140 is formed along edges of surfaces of the substrate 110 and the encapsulation unit 130, which face each other. The substrate 110 and the encapsulation unit 130 may be coupled to each other by the sealing member 140. A moisture absorbent material or a filler material may be filled or deposited in an inner space 150 between the substrate 110 and the encapsulation unit 130.

Figure 2:
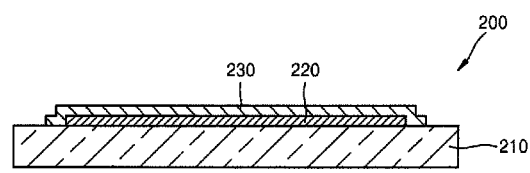
FIG. 2 is a schematic cross-sectional view of a display unit according to another embodiment of the present invention.

FIG. 2 is a schematic cross-sectional view of a display unit 200 according to another embodiment of the present invention.

Referring to FIG. 2, the display unit 200 includes a substrate 210, an organic emission unit 220 formed on the substrate 210, and an encapsulation unit 230 for sealing the organic emission unit 220.

The encapsulation unit 130 of FIG. 1 is a substrate having rigidity, while the encapsulation unit 230 of the present embodiment is a flexible film. The encapsulation unit 230 surrounds the organic emission unit 220 without forming a gap between the organic emission unit 220 and the encapsulation unit 230.

The encapsulation unit 230 may be formed of multiple layers (e.g., alternately formed) of an inorganic film formed of silicon oxide ($SiO_2$) or a silicon nitride (SiNx) and an organic film formed of an epoxy or polyimide; however, the present invention is not limited thereto. That is, the encapsulation unit 230 may have any kind of transparent thin film encapsulation structure.

Although not shown in FIG. 2, as an encapsulation structure of the organic emission unit 220, the encapsulation unit 130 of FIG. 1 may be further formed or located on the encapsulation unit 230 of FIG. 2.

Figure 3:
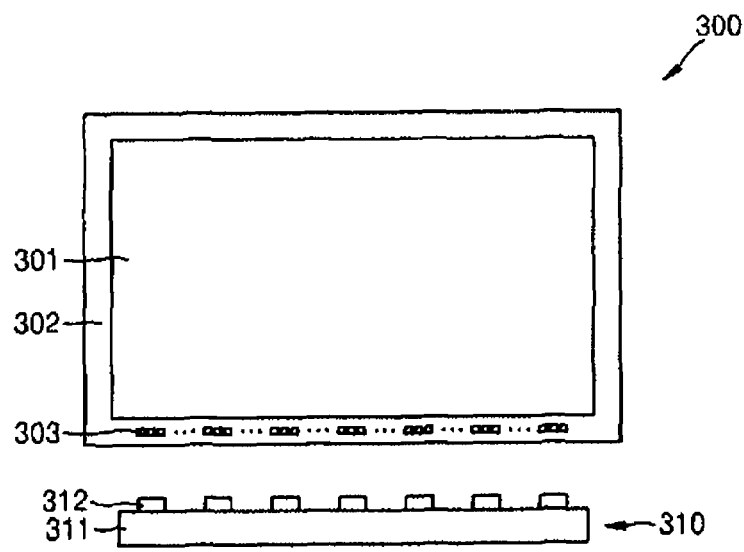
FIG. 3 is a schematic plan view showing arrangements of the display unit and a module unit according to an embodiment of the present invention.

FIG. 3 is a plan view showing arrangement of a display unit 300 and a module unit 310 according to another embodiment of the present invention.

Referring to FIG. 3, the display unit 300 includes a display area 301, and a non-display area 302 extending along the edges (e.g., the periphery) of the display area 301.

The display area 301 is an area on which the organic emission unit and a thin film transistor (TFT) are patterned to display images when operating. The non-display area 302 is an area on which a sealing material for sealing the substrate or wires electrically coupled to patterned layers of the display area 301 are formed. A plurality of pads 303 that are electrically coupled to devices formed in the display area 301 are arranged (e.g., located) at a portion of the non-display area 302.

The module unit 310 is coupled to the plurality of pads 303. The module unit 310 includes a circuit board 311. The circuit board 311 may be a flexible printed cable (FPC) that is a flexible substrate. A plurality of circuit terminals 312 are positioned (e.g., arranged or located) on the circuit board 311. The circuit terminals 312 may be coupled to the pads 303 via a thermal bonding process using an anisotropic conductive film (ACF) or a soldering process.

Figure 4:
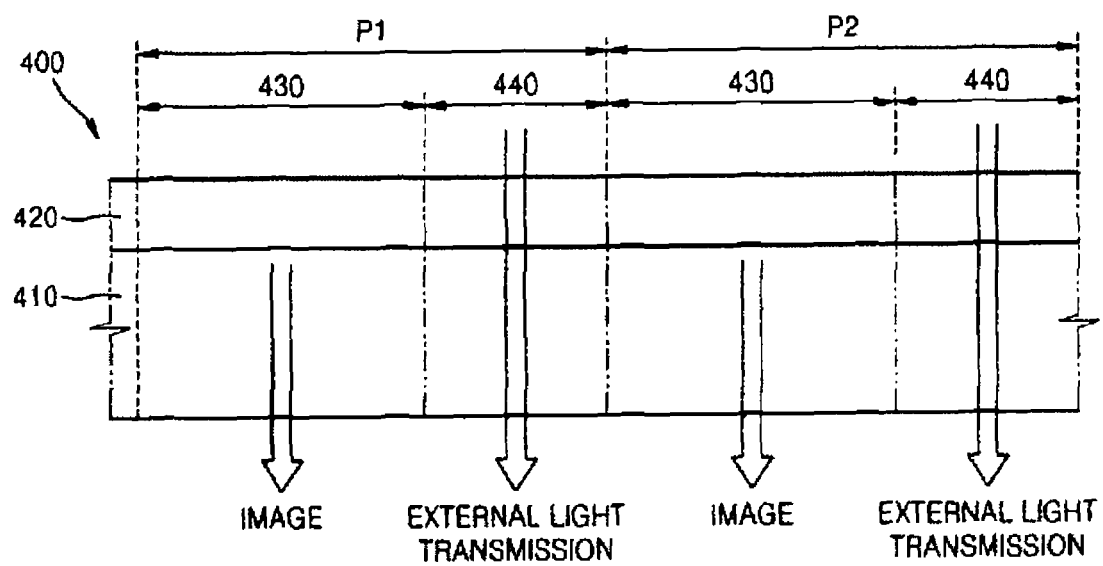
FIG. 4 is a schematic cross-sectional view of a light transmissive display unit according to an embodiment of the present invention.

FIG. 4 is a schematic cross-sectional view of a light transmissive display unit 400 according to an embodiment of the present invention.

In the embodiment of FIG. 4, the light transmissive display unit 400 may be an organic light emitting display apparatus; however, the present invention is not limited thereto. That is, any suitable kind of display device that displays images when an electric power (e.g., a predetermined electric power) is applied may be used as the light transmissive display unit 400.

Referring to FIG. 4, the light transmissive display unit 400 includes a display unit 420 formed on a substrate 410. The light transmissive unit 400 is configured to allow external light to pass or be transmitted through the substrate 410 and the display unit 420.

The display unit 420 includes a portion (e.g., region 440) configured to allow the external light to be transmitted therethrough. Thus, a user located at a side displaying the images may observe objects on the other side (e.g., the upper side of the substrate 410 in FIG. 4).

In the present embodiment, the display unit 420 is a bottom emission type in which the images are displayed toward the substrate 410; however, the present invention is not limited thereto. That is, the present invention may be applied to a top emission type in which the images of the display unit 420 are displayed in a direction away from the substrate 410. In such a case, the user may see the images of the display unit 420 from an upper side of the substrate 410, and may also observe objects on the other side of the substrate 410 (e.g., a lower side of the substrate 410 in FIG. 4).

Embodiments of the present invention are not limited to the top emission type display unit or the bottom emission type display unit, but may also be applied to a dual-emission type display unit, in which images of the display unit 420 may be displayed both in a direction toward the substrate 410 and in a direction away from the substrate 410.

Here, the light transmissive display unit 400 includes a first pixel P1 and a second pixel P2 that are adjacent to each other.

Each of the pixels P1 and P2 includes a first region 430 and a second region 440.

The images of the display unit 420 are displayed in the first region 430, and external light is transmitted (e.g., passes) through the second region 440.

Because each of the pixels P1 and P2 in the light transmissive display unit 400 includes the first region 430 for displaying images and the second region 440 for transmitting the external light, the user may observe images outside the light transmissive display unit 400 when he/she does not see the images displayed at the display unit 420.

Here, devices such as a TFT, a capacitor, and an organic light emitting device are not formed at the second region 440 so as to increase an external light transmittance through the second region 440, and accordingly, an external light transmittance of the entire display unit 420 may be improved. In addition, distortion of the transmission image due to interference of the devices such as the TFT, the capacitor, and the organic light emitting device may be reduced.

Figure 5:
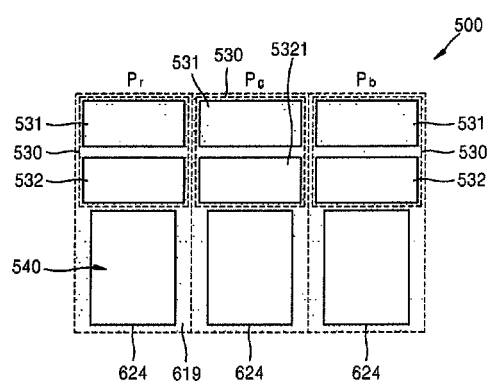
FIG. 5 is a schematic plan view of an organic emission unit included in the light transmissive display unit according to an embodiment of the present invention.
Figure 6:
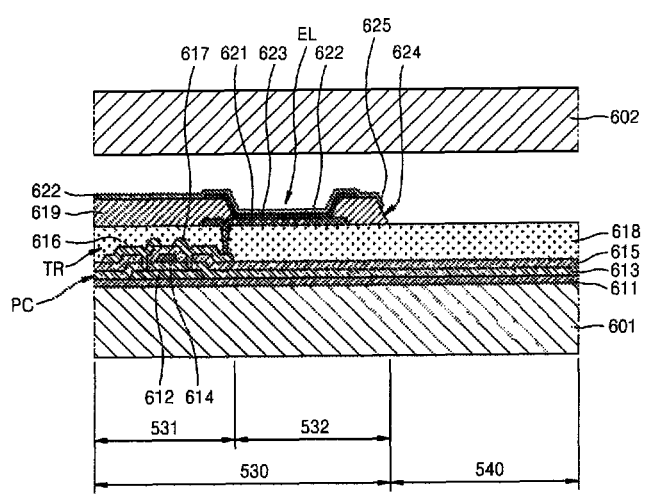
FIG. 6 is a schematic cross-sectional view of a sub-pixel included in the organic emission unit of FIG. 5.

FIG. 5 is a schematic plan view of an organic emission unit 500 included in a light transmissive display unit according to an embodiment of the present invention, and FIG. 6 is a schematic cross-sectional view of a sub-pixel included in the organic emission unit 500 of FIG. 5.

As illustrated in FIG. 5, the organic emission unit 500 includes a red sub-pixel $P_r$, a green sub-pixel $P_g$, and a blue sub-pixel $P_b$ that are adjacent to each other.

Referring to FIGS. 5 and 6, the red sub-pixel $P_r$, the green sub-pixel $P_g$, and the blue sub-pixel $P_b$ each include a circuit region 531 and a light emission region 532 in a first region 530. The circuit region 531 and the light emission region 532 are adjacent to each other.

A second region 540 configured to allow external light to pass or be transmitted is adjacent to the first region 530. The second region 540 is formed independently in each of the sub-pixels $P_r$, $P_g$, and $P_b$.

Alternatively, the second region 540 may be formed commonly throughout the sub-pixels $P_r$, $P_g$, and $P_b$. In this case, an area of the second region 540 transmitting the external light is increased, and thereby increasing a light transmittance of the entire display unit 500.

Alternately, the second regions 540 of two adjacent sub-pixels among the red, green, and blue sub-pixels $P_r$, $P_g$, and $P_b$ may be coupled to each other.

As shown in FIG. 6, a TFT TR is located at the circuit region 531. Embodiments of the present invention are not limited to one TFT TR, that is, a pixel circuit unit PC including the TFT TR may be formed. The pixel circuit unit PC may include a plurality of TFTs and a storage capacitor, in addition to the TFT TR, and may further include wires such as scan lines, data lines, and driving lines (Vdd lines) coupled to the above devices.

An organic light emitting device EL that is a light emission device is located at the light emission region 532. The organic light emitting device EL is electrically coupled to the TFT TR of the pixel circuit unit PC.

A buffer layer 611 is formed on a substrate 601. The pixel circuit unit PC including the TFT TR is formed on the buffer layer 611.

A semiconductor active layer 612 is formed on the buffer layer 611.

The buffer layer 611 is formed of a transparent insulating material. The buffer layer 611 reduces or prevents impurity atoms from infiltrating in the substrate 601 and planarizes the surface of the substrate 601, and thus, may be formed of various materials capable of performing the above functions.

For example, the buffer layer 611 may be formed of an inorganic material such as silicon oxide, silicon nitride, silicon oxynitride, aluminum oxide, aluminum nitride, titanium oxide, and titanium nitride, an organic material such as polyimide, polyester, and acryl, or a stacked substance of the inorganic and organic materials. Alternatively, the buffer layer 611 may be omitted.

The semiconductor active layer 612 may be formed of a porous silicon material; however, embodiments of the present invention are not limited thereto. That is, the semiconductor active layer 612 may be formed of oxide semiconductor, for example, a G-I—Z—O layer $[(In_2O_3)a(Ga_2O_3)b(ZnO)c$ layer] (a, b, c are real numbers respectively satisfying conditions of $a≥0, b≥0, c≥0$). When the semiconductor active layer 612 is formed of the oxide semiconductor, a light transmittance of the circuit region 531 of the first region 530 may be further improved, and accordingly, the external light transmittance of the entire display unit 600 may be improved.

A gate insulating layer 613 covering the semiconductor active layer 612 is formed on the buffer layer 611. A gate electrode 614 is formed at a region (e.g., a predetermined region) of the gate insulating layer 613. The gate electrode 614 is coupled to a gate line (not shown) applying signals for turning on/off the TFT.

An interlayer dielectric 615 formed of a transparent insulating material is formed at the gate electrode 614. A source electrode 616 and a drain electrode 617 are formed at the interlayer dielectric 615, and the source electrode 616 and the drain electrode 617 are coupled to the semiconductor active layer 612 through contact holes that are formed by partially removing the interlayer dielectric 615.

Embodiments of the present invention are not limited to the above structure, and various structures of the TFT may be applied thereto.

The structure of the TFT TR is not limited to the above example, and various kinds of TFT structures may be applied.

The first insulating layer 618 is formed to cover the pixel circuit unit PC including the TFT TR. The first insulating layer 618 may be an insulating layer having a planarized surface, and may include a single-layered or a multi-layered structure. The first insulating layer 618 may be formed of a transparent inorganic insulating material and/or an organic insulating material. The first insulating layer 618 may extend across each of the pixels.

A first electrode 621 of the organic light emitting device EL is electrically coupled to the drain electrode 617 of the TFT TR through the first insulating layer 618 and extends laterally across a portion of the surface of the first insulating layer 618 opposite the interlayer dielectric 615. The first electrode 621 is formed as an independent island type in every pixel. For example, the first electrodes 621 are separated and electrically isolated from each other and correspond to respective pixels.

A second insulating layer 619 formed of an organic insulating material and/or an inorganic insulating material is formed on the first insulating layer 618. The second insulating layer 619 covers edges of the first electrode 621, and exposes a center portion of the first insulating layer 618. The second insulating layer 619 may be configured to cover the first region 530 and the second region 540 of each pixel, and may be formed throughout the entire area of the organic light emission unit 500 of the substrate 601. However, the second insulating layer 619 is not necessarily configured to cover the entire first region 530, but covering at least a part, in particular, edges of the first electrode 621, is sufficient.

In the present embodiment, the second insulating layer 619 is formed as a single layer; however, embodiments of the present invention are not limited thereto, that is, the second insulating layer 619 may have a multi-layered structure. In addition, the second insulating layer 619 does not necessarily have a uniform thickness, and a spacer that is formed of the same material as that of the second insulating layer 619 may further protrude from an upper surface of the second insulating layer 619 for supporting the encapsulation unit 602.

An organic layer 623 and a second electrode 622 are sequentially stacked at the first electrode 621, respectively. The second electrode 622 covers the second insulating layer 619 and the organic layer 623, and is electrically coupled to the second electrodes 622 of other pixels.

The organic layer 623 may be formed of a low-molecular weight organic material or a high-molecular weight organic material.

When a low-molecular weight organic material is used, a single or multi-layer structure including at least one selected from the group consisting of a hole injection layer (HIL), a hole transport layer (HTL), an emission layer (EML), an electron transport layer (ETL), and an electron injection layer (EIL) may be formed.

Examples of available organic materials may include copper phthalocyanine (CuPc), N,N'-di(naphthalene-1-yl)-N,N'-diphenyl-benzidine (NPB), tris-8-hydroxyquinoline aluminum ($Alq_3$), and the like. The low-molecular weight organic material may be deposited in a vacuum deposition method by using masks. Here, the HIL, the HTL, the ETL, and the EIL are common layers that are applied commonly to the red, green, and blue sub-pixels.

When a high-molecular weight organic material is used, the structure including the HTL and the EML may be used, PEDOT may be used as the HTL, and a high-molecular weight organic material such as Poly-Phenylenevinylene (PPV)-based material or a polyfluorene-based material may be used to form the organic layer in a screen printing method or an inkjet printing method.

The organic layer 623 is not limited to the above examples, and various examples may be applied.

The first electrode 621 may function as an anode and the second electrode 622 may function as a cathode, or vice versa.

According to the present embodiment, the first electrode 621 may be a transparent electrode, and the second electrode 622 may be a reflective electrode. The first electrode 621 may include a material having a high work function, for example, ITO, IZO, ZnO, $In_2O_3$, and the second electrode 622 may be formed of a metal material having a low work function, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca). Therefore, the organic light emitting device EL is a bottom emission type, in which the images are displayed toward the first electrode 621.

However, embodiments of the present invention are not limited thereto, that is, the second electrode 622 may include a transparent electrode.

An encapsulation unit 602 is located on the second electrode 622. The encapsulation unit 602 is bonded or attached to the substrate 601 by an additional sealing material (e.g., sealing member 140 of FIG. 1) at an outer portion of the display unit to substantially seal the display unit from external air and contaminants. An additional filler material (not shown) may be placed in a space between the encapsulation unit 602 and the second electrode 622, or a moisture absorbent material may be placed in the space. Encapsulation of the display unit is not limited to the sealing material 602; that is, a film type encapsulation unit (e.g., encapsulation unit 230 of FIG. 2) may be used.

Meanwhile, in order to improve an external light transmittance through the second region 540, a first transmission window 624 is formed at a location corresponding to the second region 540 in the second insulating layer 619.

The first transmission window 624 may be formed by removing a portion of the second insulating layer 619, which corresponds to the second region 540. The first transmission window 624 may be formed in an island pattern. Otherwise, the first transmission window 624 may be independently formed in each of the sub-pixels $P_r$, $P_g$, and $P_b$, or may be coupled throughout the pixels $P_r$, $P_g$, and $P_b$. In addition, the first transmission windows 624 of the red pixel $P_r$, the green pixel $P_g$, and the blue pixel $P_b$ are coupled to each other, or the first transmission windows 624 of two adjacent pixels among the red, green, and blue pixels $P_r$, $P_g$, and $P_b$ may be coupled to each other.

If the first transmission window 624 is formed as in the present embodiment, the single first transmission window 624 has a large size, and thus, the external light transmittance may be improved, and the external image dispersion may be reduced.

Also, a second transmission window 625 may be further formed in the second electrode 622. The second transmission window 625 may be formed by removing a portion of the second electrode 622, which corresponds to the second region 540. The second transmission window 625 may be coupled or adjacent to the first transmission window 624. The second transmission window 625 may be also formed in the same island pattern as that of the first transmission window 624.

Although not shown in the drawings, at least one of the interlayer dielectric 615, the gate insulating layer 613, or the buffer layer 611 may further include a transmission window that is coupled to the first transmission window 624.

As described above, according to embodiments of the present invention, because the first and second regions 530 and 540 are separated from each other, an external image distortion generated due to the scattering of the external light by the patterns of the devices included in the pixel circuit unit PC when the external portion of the display unit is observed through the second region 540 may be reduced or prevented.

The first and second regions 530 and 540 are formed so that an area of the second region 540 may be formed in a range of 5 to 90% of the entire area of the first and second regions 530 and 540.

If a ratio of the area of the second region 540 with respect to the entire combined area of the first and second regions 530 and 540 is less than 5%, the light that can be transmitted through the display unit is not sufficient for the user to see objects or images located at an opposite side when the display unit is in a turned off state. That is, the display unit is not recognized as a transparent display.

By contrast, when the ratio of the area of the second region 540 with respect to the entire combined area of the first and second regions 530 and 540 is greater than or equal to about 5%, and the first region 530 is formed as an island with respect to the entire second region 540, and a high number of conductive patterns are located in the first region 530 to reduce a scattered degree of the external light, the user may recognize the display unit as a transparent display.

Moreover, if the TFT included in the pixel circuit unit PC is formed as a transparent TFT such as oxide semiconductor and the organic light emitting device is formed as a transparent device, the transparency may be increased more.

If the ratio of the area of the second region 540 with respect to the entire region of the first and second regions 530 and 540 is greater than 90%, a pixel integration of the display unit is reduced, such that images may not be effectively displayed from the light emission of the first region 530.

That is, as the area of the first region 530 is reduced, illuminance of the light emitted from the organic layer 623 has to be increased in order to display images. As described above, if the organic light emitting device operates at the high brightness level, life span of the light emitting device is rapidly degraded.

Also, if the ratio of the area of the second region 540 is increased to 90% or greater while maintaining a size of one first region 530, the area of the first region 530 is reduced, and thus, the resolution is degraded.

Thus, the ratio of the area of the second region 540 with respect to the entire area of the first and second regions 530 and 540 may be in a range of 20% to 70%.

If the above ratio is less than 20%, the area of the first region 530 may be excessively large when compared with the second region 540, and thus, there is a limitation in observing the external images via the second region 540. If the above ratio is greater than 70%, there may be a limitation in designing the pixel circuit unit PC that will be located in the first region 530.

Figure 7:
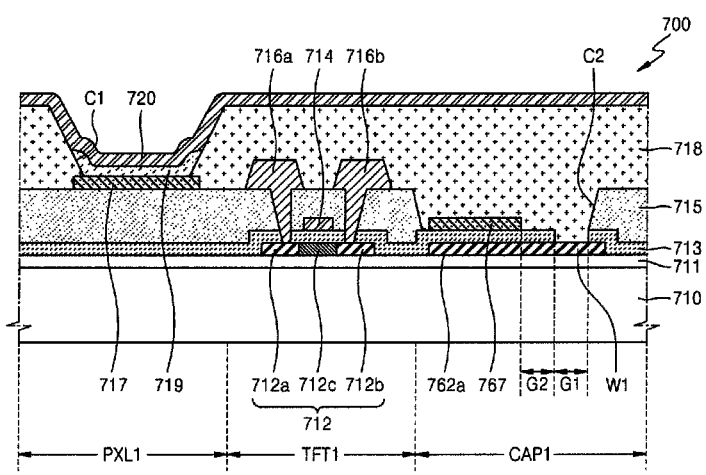
FIG. 7 is a schematic cross-sectional view of a sub-pixel of a light impermeable display unit according to an embodiment of the present invention.

FIG. 7 is a schematic cross-sectional view of a sub-pixel in a light impermeable display unit 700 according to another embodiment of the present invention.

Here, the light impermeable display unit 700 is an organic light emitting display apparatus; however, embodiments of the present invention are not limited thereto, that is, the light impermeable display unit 700 may be any kind of display apparatus that displays images when an electric power (e.g., a predetermined electric power) is applied thereto.

Referring to FIG. 7, the light non-transmissive display unit 700 includes a substrate 710. At the substrate 710, a pixel region PXL1 including a light emission layer 719, a transistor region TFT1 including a TFT, and a capacitor region CAP1 including a capacitor are formed.

The transistor region TFT1 includes a semiconductor active layer 712 formed of a TFT on the substrate 710 and a buffer layer 711. The semiconductor active layer 712 may include amorphous silicon or crystalline silicon. The semiconductor active layer 712 includes a channel region 712c, and a source region 712a and a drain region 712b doped with ion impurities on outer portions of the channel region 712c.

A gate electrode 714 is formed on the semiconductor active layer 712 at a location corresponding to the channel region 712c of the semiconductor active layer 712. The gate insulating layer 713 is located between the gate electrode 714 and the channel region 712c of the semiconductor active layer 712.

A source electrode 716a and a drain electrode 716b are respectively coupled to the source region 712a and the drain region 712b of the semiconductor active layer. An interlayer dielectric 715 is located between the source and drain electrodes 716a and 716b at the gate electrode 714.

A first insulating layer 718 is formed on the interlayer dielectric 715 to cover the source and drain electrodes 716a and 716b.

The gate insulating layer 713 and the interlayer dielectric 715 are formed as inorganic insulating layers, and the first insulating layer 718 may be formed as an organic insulating layer. The first insulating layer 718 may include universal polymers (PMMA, PS), polymer derivatives having a phenol group, acryl-based polymers, imide-based polymers, aryleter-based polymers, amide-based polymers, fluoride-based polymers, p-xylene-based polymers, vinyl alcohol-based polymers, and/or blends thereof.

In the pixel region PXL1 of the present embodiment, a first electrode 717 may be a pixel electrode formed of the same material as that of an upper electrode 767 of a capacitor located on the substrate 710, the buffer layer 711, the gate insulating layer 713, and the interlayer dielectric 715.

The first electrode 717 is formed of a transparent conductive material, and the light may be emitted toward the first electrode 717. The transparent conductive material may be at least one selected from the group consisting of ITO, IZO, ZnO, $In_2O_3$, IGO, and AZO.

An organic emission layer 719 is formed on the first electrode 717, and the light emitted from the organic emission layer 719 may be discharged toward the substrate 710 through the first electrode 717 formed of the transparent conductive material.

Meanwhile, the buffer layer 711, the gate insulating layer 713, and the interlayer dielectric 715 located under the first electrode 717 are formed of materials having different refractive indexes to serve as a distributed brag reflector (DBR), thereby improving an emission efficiency of the light emitted from the organic emission layer 719. The buffer layer 711, the gate insulating layer 713, and the interlayer dielectric 715 may be formed of $SiO_2$, SiNx, and the like.

In the present embodiment, the buffer layer 711, the gate insulating layer 713, and the interlayer dielectric 715 are formed as single layers, respectively; however, embodiments of the present invention are not limited thereto, and the above layers may respectively have multi-layered structures.

A first insulating layer 718 is formed on an outer portion of the first electrode 717, and the interlayer dielectric 715 includes a first opening C1 exposing the first electrode 717. The organic emission layer 719 is formed in the first opening C1.

The organic emission layer 719 may be formed of a low-molecular weight organic material or a high-molecular weight organic material.

When the organic emission layer 719 is formed of the low-molecular weight organic material, the HIL, the HTL, and the EIL may be stacked based on the organic emission layer 719. When the organic emission layer 719 is the high-molecular weight organic layer, the HTL may be formed in addition to the organic emission layer 719.

A second electrode 720 is formed on the organic emission layer 719 as a common electrode. In the display unit 700 of the present embodiment, the first electrode 717 is used as an anode and the second electrode 720 is used as a cathode, or vice versa.

The second electrode 720 may be formed as a reflective electrode including a reflective material. Here, the second electrode 720 may include one or more materials selected from Al, Mg, Li, Ca, LiF/Ca, and LiF/Al.

Because the second electrode 720 is formed as the reflective electrode, the light emitted from the organic emission layer 719 is reflected by the second electrode 720 and is discharged toward the substrate 710 after transmitting through the first electrode 717 formed of the transparent conductive material.

In the capacitor region CAP1, a lower electrode 762a of the capacitor may be formed of the same material as that of the semiconductor active layer 712 of the TFT, and a wiring region W1 coupled to the lower electrode 762a. An upper electrode 767 of the capacitor may be formed of the same material as that of the first electrode 717. An insulating layer 713 between the lower electrode 762a and the upper electrode 767 to correspond to the gate insulating layer is formed on the substrate 710 and the buffer layer 711.

The lower electrode 762a of the capacitor may be formed of the same material as the source region 712a and the drain region 712b of the semiconductor active layer 712 of the TFT, and may include a semiconductor material doped with ion impurities. If the lower electrode 762a is formed of an intrinsic semiconductor material that is not doped with ion impurities, the capacitor may include a metal oxide semiconductor (MOS) capacitor (MOS CAP) structure with the upper electrode 767. However, if the lower electrode 762a is formed of the semiconductor material doped with the ion impurities, the capacitor may include a metal-insulator-metal (MIM) capacitor (MIM CAP) structure, thereby increasing an electrostatic capacity. Therefore, because the MIM CAP structure may realize the same electrostatic capacity with a smaller area than that of the MOS CAP structure, the area of the capacitor may be reduced by utilizing a MIM CAP structure, thereby increasing the ability to form the pixel electrode 717 to be large and improving an aperture ratio of the pixel electrode 717.

The wiring region W1 that is located at the same level as the lower electrode 762a and coupled to the lower electrode 762 to transmit signals (electric current/voltage) is located at an outer portion of the lower electrode 762a. The wiring region W1 may include a semiconductor doped with ion impurities, like the lower electrode 762a.

The insulating layer 713 is located on the lower electrode 762a; however, there is a region where the insulating layer 713 is not formed at the outer portion of the lower electrode 762a over a portion of the wiring region W1 coupled to the lower electrode 762a. For example, the portion of the wiring region W1 where insulating layer 713 is not formed may be a coupling portion for coupling the lower electrode 762a to the wiring region W1.

In the present embodiment, the region where the insulating layer 713 is not formed is described as a part of the wiring region W1; however, embodiments of the present invention are not limited thereto. That is, the above region may be an edge of the lower electrode 762a itself, not the wiring region W1, because a boundary between the electrode and the wires may not be definitely designed in the capacitor region.

In the present embodiment, the insulating layer 713 forms a first gap G1 between the wiring region W1 at an outer portion of the lower electrode 762a where the insulating layer 713 is not formed by etching the insulating layer 713 when the insulating layer 715 corresponding to the interlayer dielectric is etched.

An upper electrode 767 is located on the insulating layer 713 corresponding to the gate insulating layer. The upper electrode 767 is formed of the same material as that of the first electrode 717. The first electrode 717 includes a transparent conductive material, and the upper electrode 767 may include the transparent conductive material.

The upper electrode 767 is laterally adjacent to a region corresponding to a second gap G2, which is adjacent to the first gap G1 in the insulating layer 713.

The insulating layer 715 corresponding to the interlayer dielectric is located on the insulating layer 713, and the insulating layer 715 includes a second opening C2 exposing the upper electrode 767, the insulating layer 713 including the first gap G1, and the insulating layer 715 including the second gap G2.

A first insulating layer 718 is formed on the insulating layer 715. The first insulating layer 718 may include an organic insulating layer. When the first insulating layer 718 including the organic insulating material having a small dielectric constant is between the second electrode 720 and the upper electrode 767, a parasitic capacitance that may be generated between the second electrode 720 and the upper electrode 767 may be reduced, thereby reducing signal interference generated due to the parasitic capacitance.

The light impermeable display unit 700 is opaque because a region for transmitting the external light is not formed unlike the light transmissive display unit of FIG. 5. Therefore, the user may not see displayed objects or images from an opposite side.

The light impermeable display unit may include the light impermeable display unit that may be used as a mirror display, as well as the general light impermeable display unit shown in FIG. 7.

Figure 13:
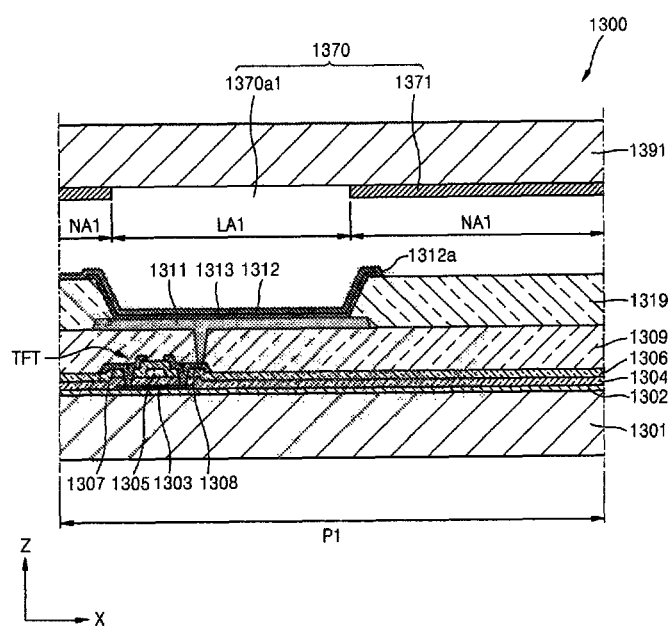
FIG. 13 is a schematic cross-sectional view of a sub-pixel of a light impermeable display unit according to another embodiment of the present invention.
Figure 14:
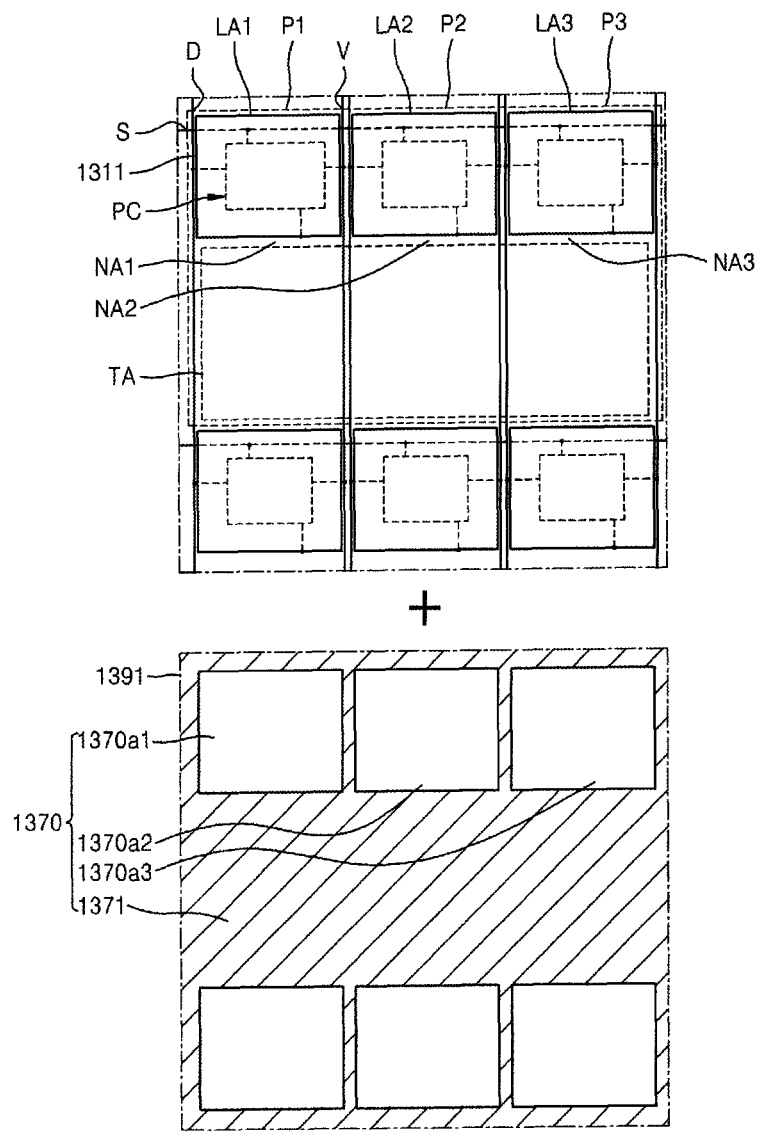
FIG. 14 is a schematic plan view of a reflective layer shown in FIG. 13.

FIG. 13 is a schematic cross-sectional view of one sub-pixel of a light impermeable display unit 1300 according to another embodiment of the present invention, and FIG. 14 is a schematic plan view of a reflective layer 1370 shown in FIG. 13.

The light permeable display unit 1300 may be an organic light emitting display apparatus that may be used as a mirror display; however, embodiments of the present invention are not limited thereto, and a display apparatus for displaying images to which an electric power (e.g., a predetermined electric power) is applied may be used.

Referring to FIGS. 13 and 14, the light impermeable display unit 1300 includes a substrate 1301 on which a display unit is formed, and an encapsulation unit 1391 coupled to the substrate 1301.

A plurality of sub-pixels is arranged on the substrate 1301. FIG. 13 shows one sub-pixel P1, and FIG. 14 shows three sub-pixels P1, P2, and P3.

The sub-pixel P1 of FIG. 13 includes a light emission area LA1 and a non-emission area NA1.

The light emission area LA1 is an area directly emitting visible rays to realize images that may be recognized by the user. On the light emission area LA1, a first electrode 1311, a second electrode 1312, and an organic emission layer 1313 are formed between the first and second electrodes 1311 and 1312.

Also, as shown in FIG. 14, a pixel circuit unit PC may be at the light emission area LA1. Data lines D, scan lines S, and a power line V may be coupled to the pixel circuit unit PC.

A buffer layer 1302 is formed on the substrate 1301. The buffer layer 1302 is a selective element, and thus, may be omitted.

A TFT TR1 is formed on the buffer layer 1302. The TFT TR1 includes a semiconductor active layer 1303, a gate electrode 1305, a source electrode 1307, and a drain electrode 1308.

First, the semiconductor active layer 1303 is formed in a pattern (e.g., a predetermined pattern) on the buffer layer 1302. The semiconductor active layer 1303 includes a source region, a drain region, and a channel region. The source and drain regions of the semiconductor active layer 1303 may be formed of amorphous silicon, or may be formed of crystalline silicon doped with group-III or group-V impurities.

A gate insulating layer 1304 is formed on the semiconductor active layer 1303, and a gate electrode 1305 is formed on a region (e.g., a predetermined region) on the gate insulating layer 1304. The gate insulating layer 1304 may be formed of an organic material or an inorganic material such as SiNx or $SiO_2$ for insulating the semiconductor active layer 1303 from the gate electrode 1305.

The gate electrode 1305 may include Au, Ag, Cu, Ni, Pt, Pd, Al, or molybdenum (Mo), and an alloy such as aluminum-neodymium (Al:Nd) alloy or molybdenum-tungsten (Mo:W) alloy; however, embodiments of the present invention are not limited thereto. The gate electrode 1305 may be formed to have a single-layered structure or a multi-layered structure.

An interlayer dielectric 1306 is formed on the gate electrode 1305. The interlayer dielectric 1306 and the gate insulating layer 1304 are formed to expose the source region and the drain region of the semiconductor active layer 1303, and the source electrode 1307 and the drain electrode 1308 are formed to contact the exposed source and drain regions of the semiconductor active layer 1303, respectively.

The source electrode 1307 and the drain electrode 1308 may be formed of various conductive materials, and may have single-layered or multi-layered structures.

A passivation layer 1309 is formed on the TFT TR1. In more detail, the passivation layer 1309 is formed on the source and drain electrodes 1307 and 1308.

The passivation layer 1309 does not cover the entire portion of the drain electrode 1308, and is configured to expose a region (e.g., a predetermined region) of the electrode 1308. A first electrode 1311 is coupled to the exposed region of the drain electrode 1308.

The first electrode 1311 may be formed as an independent island type in each of the sub-pixels. A pixel defining layer 1319 is formed on the passivation layer 1318 and covers the edges of the first electrode 1311 without covering a central region or portion of the first electrode 1311.

The organic emission layer 1313 is formed on the first electrode 1311.

The second electrode 1312 is formed on the organic emission layer 1313.

The non-emission area NA1 is formed around the light emission area LA1 to be adjacent to the light emission area LA1. The non-emission area NA1 may include a transmission area TA. The transmission area TA may be formed by forming a transmission window 1312a in the second electrode 1312.

The transmission area TA may be formed by forming the transmission window 1312a in the second electrode 1312 and further forming a transmission window in the pixel defining layer 1319. That is, the transmission window may be formed in one or more insulating layers (not shown) or one or more conductive layers (not shown) formed on the substrate.

Meanwhile, as shown in FIG. 14, the sub-pixels P1, P2, and P3, respectively, include light emission areas LA1, LA2, and LA3, and the sub-pixels P1, P2, and P3 may include a common transmission window TA. However, embodiments of the present invention are not limited thereto, and the sub-pixels P1, P2, and P3 may respectively include the transmission regions, like the light emission areas LA1, LA2, and LA3.

As shown in FIGS. 13 and 14, a reflective layer 1370 is formed on a surface of the encapsulation unit 1391. In more detail, the reflective layer 1370 is formed on a surface of the encapsulation unit 1391, which faces the substrate 1301. The reflective layer 1370 includes one or more openings 1370a1, 1370a2 (shown in FIG. 14), and 1370a3 (shown in FIG. 14), and a reflective surface 1371. The reflective surface 1371 is disposed around the openings 1370a1, 1370a2, and 1370a3. Also, the reflective surface 1371 is formed to correspond to the non-emission areas NA1, NA2, and NA3, and the openings 1370a1, 1370a2, and 1370a3 are formed to correspond to the light emission areas LA1, LA2, and LA3.

In more detail, the first opening 1370*a*1 of the reflective layer 1370 corresponds to the first light emission area LA1 of the sub-pixel P1, the second opening 1370*a*2 of the reflective layer 1370 corresponds to the second light emission area LA2 of the sub-pixel P2, and the third opening 1370*a*3 of the reflective layer 1370 corresponds to the third light emission area LA3 of the sub-pixel P3. The reflective surface 1371 of the reflective layer 1370 is respectively formed at the non-emission areas NA1, NA2, and NA3 of the sub-pixels P1, P2, and P3 around the openings 1370*a*1, 1370*a*2, and 1370*a*3. Thus, the reflective surface 1371 overlaps the transmission areas TA of the non-emission areas NA1, NA2, and NA3.

The reflective surface 1371 may be formed of a material having a high reflectivity. For example, the reflective surface 1371 may be formed of a metal material (e.g., a predetermined metal material), for example, Ni, Cr, W, vanadium (V), or Mo.

Also, the reflective surface 1371 may have a predetermined thickness. For example, the reflective surface 1371 may have a thickness of 500 angstroms (Å) or greater. If the thickness of the reflective surface 1371 is less than a desired thickness, a part of the light transmits through the reflective surface 1371 and the reflective surface 1371 has a reflectivity that is less than a desired level. Then, a mirror display function desired by the light impermeable display unit 1300 may not be effectively realized.

As described above, the encapsulation unit 1391 includes the reflective surface including the openings 1370*a*1, 1370*a*2, and 1370*a*3 corresponding to the light emission areas LA1, LA2, and LA3 of the sub-pixels while reducing the impact on the image display of the light emission areas LA1, LA2, and LA3, and thus, the light impermeable display unit 1300 may function as the mirror display.

Also, the pixel circuit unit PC including the TFT TR1 is disposed in the light emission areas LA1, LA2, and LA3 so as to increase the light emission areas LA1, LA2, and LA3 in a case of a top emission type in which the image emitted from the light emission areas LA1, LA2, and LA3 is displayed toward the encapsulation unit 1391, and thereby increasing the aperture ratio and improving the image quality.

Each of the pixels P1, P2, and P3 selectively includes the transmission area TA in the non-emission area NA1, NA2, or NA3, and the reflective surface 1371 is configured to correspond to the transmission area so that the light reflected by the reflective surface 1371 may be effectively transmitted through the transmission area TA toward the user.

As such, when the image emitted from the light emission areas LA1, LA2, and LA3 of the light impermeable display unit 1300 is displayed toward the encapsulation unit 1391, the light reflected from the reflective surface 1371 is easily transmitted through the transmission area TA toward the substrate 1301 so that a general mirror effect may be shown at the substrate 1301 side.

Meanwhile, the region for performing as a mirror is not limited to a surface of the encapsulation unit 1391, which faces the substrate 1301, that is, a thin metal layer may be formed at an outer surface of the encapsulation unit 1391 to perform as a mirror.

Here, when the display unit is used as a window display in a place like a large store, a large-sized screen may be realized by arranging a plurality of display units adjacent to one another in a matrix of display units. Here, the above described light transmissive display units and the light impermeable display units are combined in order for the user to see objects or images located at an opposite side to the display apparatus.

Figure 8:
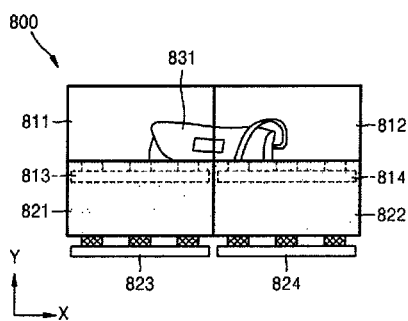
FIG. 8 is a schematic front view of a multi-display apparatus according to an embodiment of the present invention.
Figure 9:
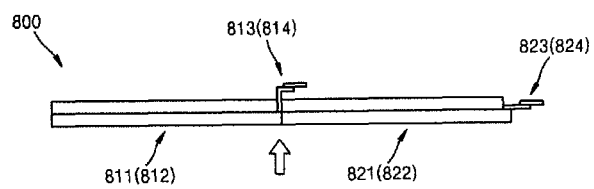
FIG. 9 is a schematic side view of the multi-display apparatus of FIG. 8.

FIG. 8 is a schematic front view of a multi-display apparatus 800 according to an embodiment of the present invention, and FIG. 9 is a schematic side view of the multi-display unit 800 of FIG. 8.

Referring to FIGS. 8 and 9, the multi-display apparatus 800 includes at least one or more light transmissive display units, and at least one or more light impermeable display units. In the present embodiment, the light transmissive display units include a first light transmissive display unit 811 and a second light transmissive display unit 812, and the light impermeable display units include a first light impermeable display unit 821 and a second light impermeable display unit 822.

The first light transmissive display unit 811 and the second light transmissive display unit 812 are coupled to each other in a horizontal direction (X-axis direction), and the first light impermeable display unit 821 and the second light impermeable display unit 822 are coupled to each other in the horizontal direction (X-axis direction).

Also, the first light impermeable display unit 821 is coupled to the first light transmissive display unit 811 in a vertical direction (Y-axis direction), and the second light impermeable display unit 822 is coupled to the second light transmissive display unit 812 in the vertical direction (Y-axis direction).

As such, the plurality of light transmissive display units 811 and 812 and the plurality of light impermeable display units 821 and 822 are coupled to each other in a matrix of adjacently arranged display units. In FIG. 8, on an upper portion in the vertical direction (Y-axis direction), the first light transmissive display unit 811 and the second light transmissive display unit 812 are arranged in parallel, and on a lower portion of the vertical direction (Y-axis direction), the first light impermeable display unit 821 and the second light impermeable display unit 822 are arranged in parallel.

In the present embodiment, a pair of light transmissive display units 811 and 812 and a pair of light impermeable display units 821 and 822 are arranged above and below in the vertical direction (Y-axis direction); however, the light transmissive display units and the light impermeable display units may be arranged alternately so as to form three or more layers in the vertical direction (Y-axis direction).

Also, embodiments of the present invention are not limited to the above arranging example, that is, a pair of a light transmissive display unit and a light impermeable display unit is continuously arranged in the horizontal direction (X-axis direction), and the above pairs may be successively arranged in the vertical direction (Y-axis direction) so that the display units of the opposite types may be located above and below.

Accordingly, the user may observe an object 831 located at an opposite side through the first light transmissive display unit 811 and the second light transmissive display unit 812 located on the upper portion of the vertical direction (Y-axis direction).

Here, the first light transmissive display unit 811 includes a first module unit 813 at a lower edge thereof in the vertical direction (Y-axis direction), and the second light transmissive display unit 812 includes a second module unit 814 at a lower edge in the vertical direction (Y-axis direction). The first module unit 813 and the second module unit 814 include substrates such as flexible printed cables that are electrically coupled to the first light transmissive display unit 811 and the second light transmissive display unit 812, respectively.

The first light impermeable display unit 821 includes a third module unit 823 at a lower edge thereof in the vertical direction (Y-axis direction), and the second light impermeable display unit 822 includes a fourth module unit 824 at a lower edge thereof in the vertical direction (Y-axis direction).

The third module unit 823 and the fourth module unit 824 include substrates such as flexible printed cables that are electrically coupled to the first light impermeable display unit 821 and the second light impermeable display unit 822, respectively.

Here, the first and second module units 813 and 814 are located inside of the multi-display apparatus 800, and coupled (e.g., bonded or attached) at portions between the display units. The first and second module units 813 and 814 are located at sides of (e.g., overlap with) the first light impermeable display unit 821 and the second light impermeable display unit 822, respectively. Therefore, when the user recognizes the object 831 located at the opposite side through the first light transmissive display unit 811 and the second light transmissive display unit 812, the first and second module units 813 and 814 may be hidden in the multi-display apparatus 800 so that the user may not recognize the existence of the first and second module units 813 and 814.

The first and second module units 813 and 814 are located at rear portions of the first light impermeable display unit 821 and the second light impermeable display unit 822. Here, the first module unit 813 and the second module unit 814 are not fixed on a fixing members located on the first light impermeable display unit 821 and the second light impermeable display unit 822, but may be located in curved states, because the first and second module units 813 and 814 are formed of flexible substrates.

Alternatively, the first and second module units 813 and 814 may be fixed on fixing members such as supports located on the first light impermeable display unit 821 and the second light impermeable display unit 822.

As described above, when the large-sized display apparatus 800 is formed, one or more light transmissive display units 811 and 812 and one or more light impermeable display units 821 and 822 are alternately arranged in a direction, the module units 813 and 814 of the light transmissive display units 811 and 812 located at bonded or attached portions of the display units are disposed adjacent to the light transmissive display units 811 and 812 and located at rear portions of the light impermeable display units 821 and 822 that do not transmit light. Accordingly, the images may be displayed by the light impermeable display units 821 and 822, and moreover, the object 831 located at the opposite side of the user may be easily observed through the light transmissive display units 811 and 812.

Figure 10:
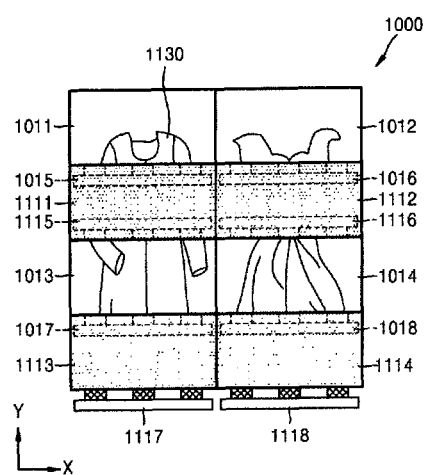
FIG. 10 is a schematic front view of a multi-display apparatus according to another embodiment of the present invention.
Figure 11:
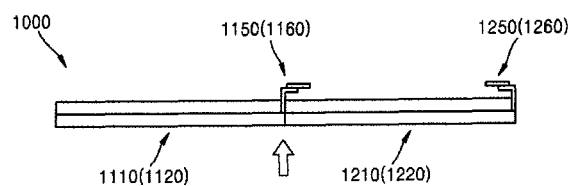
FIG. 11 is a schematic side view of the multi-display apparatus of FIG. 10.

FIG. 10 is a schematic front view of a multi-display apparatus 100 according to another embodiment of the present invention, and FIG. 11 is a schematic side view of the multi-display apparatus 1000 of FIG. 10.

Referring to FIGS. 10 and 11, the multi-display apparatus 1000 includes a plurality of first through fourth light transmissive display units 1011 through 1014, and a plurality of first through fourth light impermeable display units 1111 through 1114.

The light transmissive display units include the first through fourth light transmissive display units 1011, 1012, 1013, and 1014, and the light impermeable display units include the first through fourth light impermeable display units 1111, 1112, 1113, and 1114, according to the present embodiment; however, the number of display units is not limited thereto.

Here, in a horizontal direction (X-axis direction) of FIG. 10, pairs of light transmissive display units 1011 and 1014 are coupled to (e.g., engaged with) each other and pairs of light impermeable display units 1111 through 1114 are coupled to (e.g., engaged with) each other.

Also, in a vertical direction (Y-axis direction) of FIG. 10, a pair of light transmissive display units 1011 through 1014 and a pair of light impermeable display units 1111 through 1114 are alternately arranged with each other. Here, the pair of light transmissive display units 1011 through 1014 and the pair of light impermeable display units 1111 through 1114 adjacent to the pair of the light transmissive display units are coupled to (e.g., engaged with) each other, of course.

As described above, the plurality of light transmissive display units 1011 through 1014 and the plurality of light impermeable display units 1111 through 1114, a total number of 8, are coupled to each other in a matrix of adjacent display units so that adjacent edges are coupled to (e.g., engaged with) each other, and alternately arranged in the vertical direction (Y-axis direction).

Here, first through fourth module units 1015 through 1018 are located at lower edges of the first through fourth light transmissive display units 1011 through 1014 in the vertical direction (Y-axis direction). In addition, fifth through eighth module units 1115 through 1118 are located at lower edges of the first through fourth light impermeable display units 1111 through 1114 in the vertical direction (Y-axis direction).

The first through fourth module units 1015 through 1018 are located at bonded or attached portions between the display units and the fifth and sixth module units 1115 and 1116 of the first and second light impermeable display units 1111 and 11112 are located at sides of the first through fourth light impermeable display units 1111 through 1114.

In more detail, the first and second module units 1015 and 1016 that are electrically coupled to the first and second light transmissive display units 1011 and 1012 and are located at upper rear portions of the first and second light impermeable display units 1111 and 1112 that are adjacent to the first and second light transmissive display units 1011 and 1012.

Also, the fifth and sixth module units 1115 and 1116 that are electrically coupled to the first and second light impermeable display units 1111 and 1112 are located at lower rear portions of the first and second light impermeable display units 1111 and 1112 by being curved upward.

Therefore, the first and second module units 1015 and 1016 and the fifth and sixth module units 1115 and 1116 are located at the rear portions of the first and second light impermeable display units 1111 and 1112.

The third and fourth module units 1017 and 1018 that are electrically coupled to the third and fourth light transmissive display units 1013 and 1014 are located at lower rear portions of the third and fourth light impermeable display units 1113 and 1114 that are coupled to (e.g., engaged with) the third and fourth light transmissive display units 1013 and 1014.

On the other hand, the seventh and eighth module units 1117 and 1118 that are electrically coupled to the third and fourth light impermeable display units 1113 and 1114 are located at the outermost portion of the multi-display apparatus 100 in the vertical direction (Y-axis direction) thereof, and do not affect recognition of object 1130. Thus, there is no need to locate the seventh and eighth module units 1117 and 1118 toward the third and fourth light impermeable display units 1113 and 1114.

As described above, when the large-sized multi-display apparatus 1000 is formed, the plurality of light transmissive display units 1011 through 1014 and the plurality of light impermeable display units 1111 through 1114 are alternately arranged in the vertical direction (Y-axis direction), and the module units 1015 through 1018 of the light transmissive display units 1011 through 1014 and the module units 1115 and 1116 of the light impermeable display units 1111 through 1114 located at bonded or attached portions of the multi-display apparatus 1000 are located at the rear portions of the light impermeable display units 1111 through 1114. Accordingly, general image display may be performed by the light impermeable display units 1111 through 1114, and moreover, the object 1130 located at an opposite side of the user may be observed through the light transmissive display units 1011 through 1014.

Figure 12:
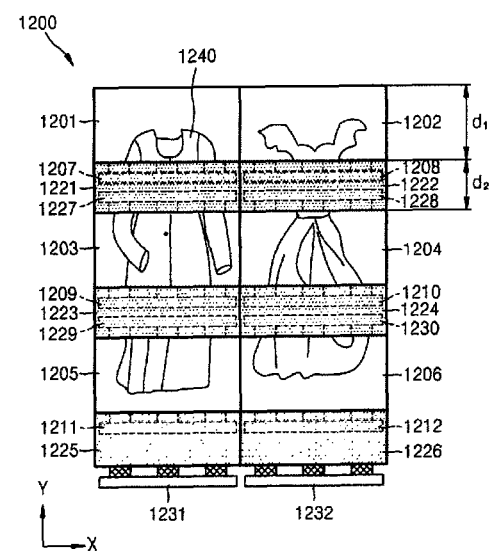
FIG. 12 is a schematic front view of a multi-display apparatus according to another embodiment of the present invention.

FIG. 12 is a schematic front view of a multi-display apparatus 1200 according to another embodiment of the present invention.

Referring to FIG. 12, the multi-display apparatus 1200 includes a plurality of first through sixth light transmissive display units 1201 through 1206, and a plurality of first through sixth light impermeable display units 1221 through 1226.

In the present embodiment, the light transmissive display units include the first through sixth light transmissive display units 1201, 1202, 1203, 1204, 1205, and 1206, and the light impermeable display units include the first through sixth light impermeable display units 1221, 1222, 1223, 1224, 1225, and 1226.

Here, in a horizontal direction (X-axis direction) of FIG. 12, two of the light transmissive display units 1201 through 1206 are coupled to (e.g., engaged with) each other, and two of the light impermeable display units 1221 through 1226 are coupled to (e.g., engaged with) each other.

In a vertical direction (Y-axis direction) of FIG. 12, pairs of the light transmissive display units 1201 through 1206 and pairs of the light impermeable display units 1221 through 1226 are alternately arranged. Here, a pair of light transmissive display units 1201 through 1206 and a pair of light impermeable display units 1221 and 1226, which is adjacent to the above pair of the light transmissive display units in the vertical direction, are coupled to (e.g., engaged with) each other.

Also, first through sixth module units 1207 through 1212 are located at lower edges of the first through sixth light transmissive display units 1201 and 1206 in the vertical direction (Y-axis direction). Seventh through twelfth module units 1227 through 1232 are located at lower edges of the first through sixth light impermeable display units 1221 and 1226 in the vertical direction (Y-axis direction).

Here, the plurality of module units 1207 through 1212 of the plurality of light transmissive display units 1201 through 1206 located in the multi-display apparatus 1200 and the plurality of module units 1227 through 1230 of the plurality of light impermeable display units 1221 through 1224 are located toward inside of the light impermeable display units 1221 through 1226.

Here, a length (e.g., height) of the each of first through sixth light transmissive display units 1201 through 1206 in the vertical direction (Y-axis direction), that is, a longitudinal length d1 is longer than a longitudinal length d2 of each of the first through sixth light impermeable display units 1221 through 1226.

Here, the longitudinal length d2 of the first through sixth light impermeable display units 1221 through 1226 may be configured to have a minimum length for covering the first through sixth module units 1207 through 1212 and the seventh through tenth module units 1227 through 1230.

The longitudinal lengths of the light transmissive display unit and the light impermeable display unit are different from each other, so that the first through sixth module units 1207 through 1212 and the seventh through tenth module units 1227 through 1230 located inside the multi-display apparatus 1200 are not exposed to outside, and at the same time, so that blocking of an object 1240 located at an opposite side of the user due to the first through sixth light impermeable display units 1221 through 1226 may be reduced or prevented.

As described above, according to the multi-display apparatus of embodiments of the present invention, the module units of the light transmissive display units, which are located in a screen where the display units are coupled (e.g., bonded or attached) when the plurality of display units are combined to one large-sized screen, are located at rear surfaces of the light impermeable display units, and accordingly, the module units are not visible through the light impermeable display units.

Also, by arranging the light transmissive display units and the light impermeable display units alternately, the module units of the light transmissive display units may not be visible.

While the present invention has been particularly shown and described with reference to exemplary embodiments thereof, it will be understood by those of ordinary skill in the art that various changes in form and details may be made therein without departing from the spirit and scope of the present invention as defined by the following claims, or their equivalents.

What is claimed is:

1. A multi-display apparatus comprising:
    a first display comprising a region configured to allow external light to pass through the first display;
    a first module electrically coupled to the first display;
    a second display coupled to the first display, the second display overlapping the first module and being configured to not allow external light to pass therethrough; and
    a second module electrically coupled to the second display.

2. The multi-display apparatus of claim 1, wherein the first display and the second display are alternately arranged in a direction and coupled to each other, and the first module is coupled to a pad at an edge of the first display that is coupled to the second display.

3. The multi-display apparatus of claim 2, wherein the direction is a vertical direction, and the first module is behind the second display.

4. The multi-display apparatus of claim 2, wherein the direction is a vertical direction, and the first module and the second module are behind the second display.

5. The multi-display apparatus of claim 4, wherein the second display covers the first module and the second module.

6. The multi-display apparatus of claim 2, wherein a plurality of the first displays are successively arranged in a horizontal direction, and a plurality of the second displays are successively arranged in the horizontal direction, and the first and second displays are alternately arranged in a vertical direction.

7. The multi-display apparatus of claim 6, wherein the first module is at a lower edge of the first display in the vertical direction, and is behind the second display that is coupled to the first display in the vertical direction.

8. The multi-display apparatus of claim 6, wherein the first module and the second module are at lower edges of the first display and the second display in the vertical direction, respectively, and the first module and the second module are behind the second display.

9. The multi-display apparatus of claim 8, wherein a height of the first display is greater than a height of the second display.

10. The multi-display apparatus of claim 9, wherein the second display covers the first module and the second module.

11. The multi-display apparatus of claim 1, wherein the first module and the second module comprise flexible circuit boards that are electrically coupled to a pad of the first display and a pad of the second display, respectively.

12. A multi-display apparatus comprising:
a first display comprising a region configured to allow external light to pass therethrough;
a first module electrically coupled to the first display;
a second display coupled to the first display, the second display overlapping the first module and being configured to not allow external light to pass therethrough; and
a second module electrically coupled to the second display,
wherein the first display comprises a transparent organic light emitting display apparatus comprising:
a substrate;
an encapsulation unit on the substrate;
a plurality of pixels on the substrate, wherein each of the pixels comprises:
a first region comprising a light emission region; and
a second region comprising a transmission region configured to allow external light to pass therethrough; and
an organic light emitting device at the light emission region of the pixels, and comprising a first electrode, a light emission layer, and a second electrode.

13. The multi-display apparatus of claim 12, wherein each of the pixels comprises:
a pixel circuit comprising a thin film transistor (TFT) at the first region;
a first insulating layer covering the pixel circuit; and
a second insulating layer on the first insulating layer, covering edges of the first electrode electrically coupled to the pixel circuit, and comprising a transmission window at the second region.

14. The multi-display apparatus of claim 13, wherein the first region of each of the pixels comprises a light emission region and a circuit region, the TFT is at the circuit region, the first electrode is at the light emission region, and the light emission region and the circuit region are adjacent to each other in each of the pixels.

15. The multi-display apparatus of claim 13, wherein the second region is independently formed in each of the pixels.

16. The multi-display apparatus of claim 13, wherein the second regions of at least two adjacent pixels are coupled to each other.

17. The multi-display apparatus of claim 13, wherein the transmission window comprises a portion of the second insulating layer removed at a location corresponding to the second region.

18. A multi-display apparatus comprising:
a first display comprising a region configured to allow external light to pass therethrough;
a first module electrically coupled to the first display;
a second display coupled to the first display, the second display overlapping the first module and being configured to not allow external light to pass therethrough; and
a second module electrically coupled to the second display,
wherein the second display comprises an opaque organic light emitting display, and the opaque organic light emitting display comprises:
a substrate;
an encapsulation unit on the substrate;
a thin film transistor (TFT) on the substrate, the TFT comprising a semiconductor active layer, a gate electrode, a source electrode, a drain electrode, and a plurality of insulating layers between the electrodes; and
an organic light emitting device electrically coupled to the TFT comprising a first electrode, an organic emission layer on the first electrode, and a second electrode on the organic emission layer in each of pixels, wherein the opaque organic light emitting display is configured to not allow external light to pass therethrough.

19. The multi-display apparatus of claim 18, further comprising:
a plurality of pixels at the substrate, wherein the pixels comprise a light emission region and a non-emission region, and
a reflective layer at a surface of the encapsulation unit facing the substrate, wherein the reflective layer comprises openings corresponding to the light emission region and a reflective surface formed around the openings and corresponding to the non-emission region.

20. The multi-display apparatus of claim 19, wherein the non-emission region further comprises a transmission region overlapping the reflective surface.

* * * * *